United States Patent [19]

Kuo

[11] Patent Number: 5,529,353
[45] Date of Patent: Jun. 25, 1996

[54] SEALING DEVICE FOR ELECTRICAL METER

[76] Inventor: Tien-yu Kuo, No. 204, Hsinhsing Rd., Tainan, Taiwan

[21] Appl. No.: 419,614

[22] Filed: Apr. 10, 1995

[51] Int. Cl.$^6$ .................................................. B65D 27/30
[52] U.S. Cl. .................................. 292/307 R; 292/256.6; 403/338; 220/319
[58] Field of Search .......................... 292/256.6, 307 R, 292/316, 307 B, 299; 220/319; 403/335, 338

[56] References Cited

U.S. PATENT DOCUMENTS 4,146,258  3/1979  Andruchiw ........................ 292/256.6

*Primary Examiner*—Rodney M. Lindsey

*Attorney, Agent, or Firm*—Watson Cole Stevens Davis

[57] ABSTRACT

A sealing device for an electrical meter includes a positioning ring and a fragile outer ring. The positioning ring is integral with an upper end of a meter socket and includes an oblique circular upper end which inclines outwardly, an outer peripheral wall which has an annular recess therein, and an annular ledge extending radially outwardly from a lower end thereof and having a plurality of spaced-apart apertures therein. The outer ring is L-shape in section and includes first and second annular arms disposed perpendicular to each other. One annular engaging member projects outwardly from an inner wall of the second annular arm which is concentrically disposed around the positioning ring for engaging with the annular recess in the positioning ring. A plurality of spaced-apart lugs extend downwardly from a bottom of the second annular arm for engaging with the apertures in the positioning ring to prevent rotational movement of the outer ring.

2 Claims, 6 Drawing Sheets

SEALING DEVICE FOR ELECTRICAL METER

BACKGROUND OF THE INVENTION

1. Field of the Invention

The present invention relates to a sealing device for interconnecting an electrical meter and a junction box or meter socket such that unauthorized separation of the two can be readily detected.

2. Description of Related Art

FIG. 7 of the drawing illustrates a conventional metallic sealing means to prevent the reading on the electrical meter from being tampered with by an unauthorized person. The electrical meter is sealed in a transparent enclosure 93 and has a radially outwardly extending base which is seated upon a rim or flange of a meter socket 94. The metallic sealing means includes a discontinuous outer ring 80 with a gap 81 defined between two distal ends thereof and a slot 82 defined in a periphery thereof. After the electrical meter is sealed in the transparent enclosure 93 an inner ring 90 having a radially outwardly extending tongue 92 is mounted to interconnect the base and the meter socket 94. Thereafter, the outer ring 80 is concentrically mounted around the inner ring 90 in a manner that the tongue 92 passes through the slot 82. Finally, a wire is passed through an aperture 91 defined in the tongue 92 and the ends of the wire are interconnected by a metallic seal 95 which is too large to pass through the slot 82.

A shortcoming of the above-mentioned sealing means is that one may enlarge the width of the slot 82 by sharp tools until it allows the metallic seal 95 to pass therethrough, which means that the outer ring 80, the inner ring 90 and the enclosure 93 are now removable and one may reduce the number of the reading on the electrical meter to achieve the purpose of reducing the amount to be paid for electricity consumption. Afterwards, one may reassemble the parts and hammer the area surrounding the slot 82 to a flat manner. As a result, the electricity controlling authority cannot take any legal action without the evidence of breakage of the metallic seal although there are signs of disturbance around the slot 82.

U.S. Pat. No. 4,146,258 to Roman Andruchiw discloses a sealing device for an electrical meter in which a fragile outer band and an inner band are used such that unauthorized tampering with the electrical meter can be readily detected.

The present invention provides an improved design in this regard.

SUMMARY OF THE INVENTION

In accordance with one aspect of the present invention, a sealing device for an electrical meter includes a positioning ring and a fragile outer ring. The positioning ring is integral with a meter socket and is disposed around a flange which is formed on an upper end of the meter socket. The positioning ring includes an oblique circular upper end which inclines outwardly and an outer peripheral wall which has an annular recess therein. The positioning ring further includes an annular ledge extending radially outwardly from a lower end thereof and having a plurality of spaced-apart apertures therein.

The outer ring is L-shape in section and includes first and second annular arms disposed perpendicular to each other. One annular engaging member projects outwardly from an inner wall of the second annular arm which is concentrically disposed around the positioning ring for engaging with the annular recess in the positioning ring. A plurality of spaced-apart lugs extend downwardly from a bottom of the second annular arm for engaging with the apertures in the positioning ring to prevent rotational movement of the outer ring.

By such an arrangement, unauthorized tampering with the electrical meter can be readily detected as such action will cause breakage of the fragile outer ring.

In accordance with another aspect of the present invention, the fragile outer ring is provided with a plurality of spaced-apart notches at a bottom thereof while the positioning ring includes a plurality of spaced-apart lugs on the annular ledge thereof to prevent rotational movement of the outer ring.

Other objects, advantages, and novel features of the invention will become more apparent from the following detailed description when taken in conjunction with the accompanying drawings.

DESCRIPTION OF THE PREFERRED EMBODIMENTS

Figure 1:
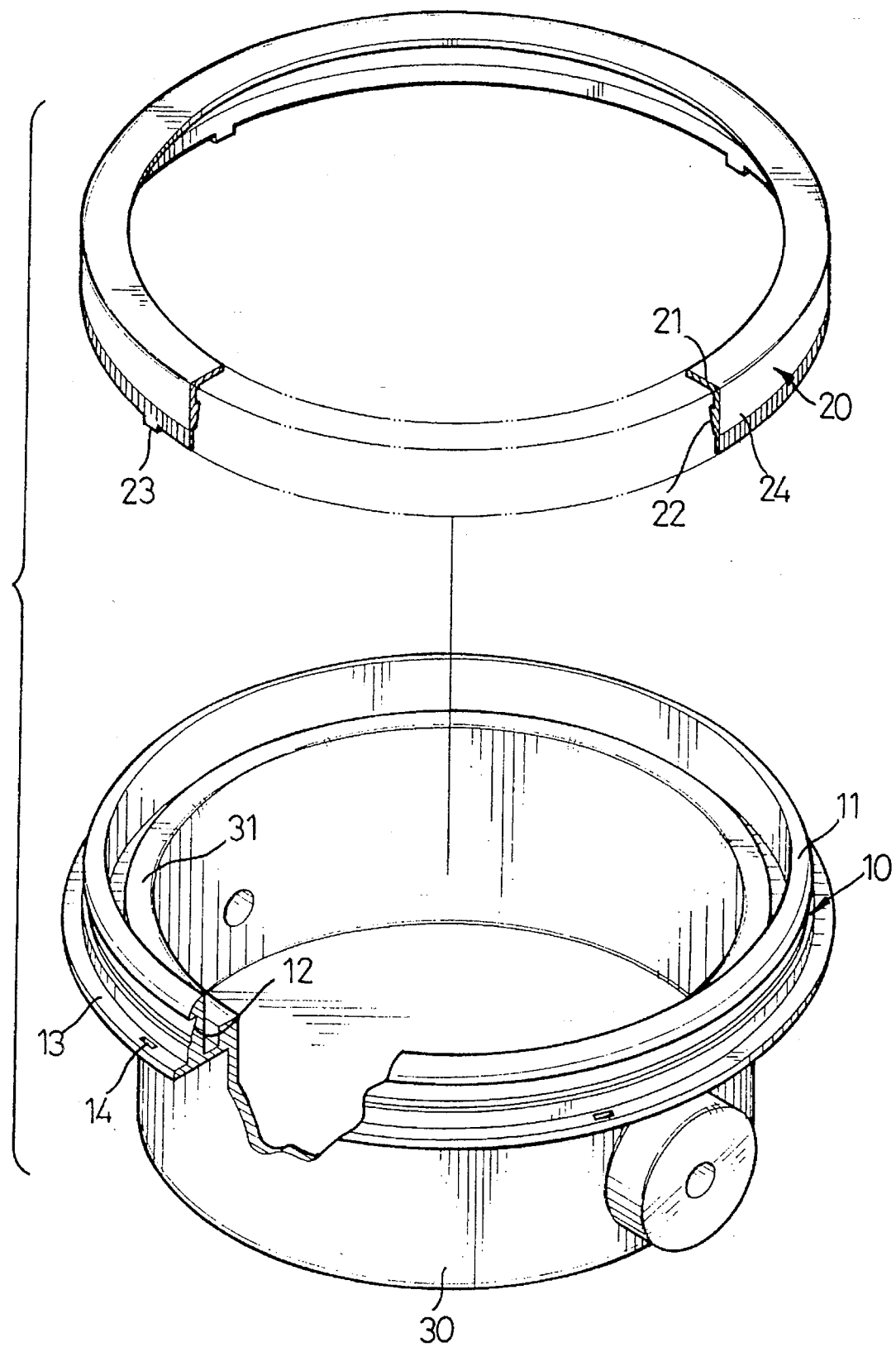
FIG. 1 is an exploded perspective view, partly cut away, of a sealing device for an electrical meter in accordance with the present invention and a meter socket to which the sealing device is mounted.

Referring to the drawings and initially to FIG. 1, a sealing device for an electrical meter in accordance with the present invention generally includes a positioning ring 10 and a fragile outer ring 20. The positioning ring 10 is integral with a meter socket 30 and is disposed around a flange 31 which is formed on an upper end of the meter socket 30. The positioning ring 10 includes an oblique circular upper end 11 which inclines outwardly and an outer peripheral wall which has an annular recess 12 therein. The positioning ring 10 further includes an annular ledge 13 extending radially outwardly from a lower end thereof and having a plurality of spaced-apart apertures 14 therein.

Figure 3:
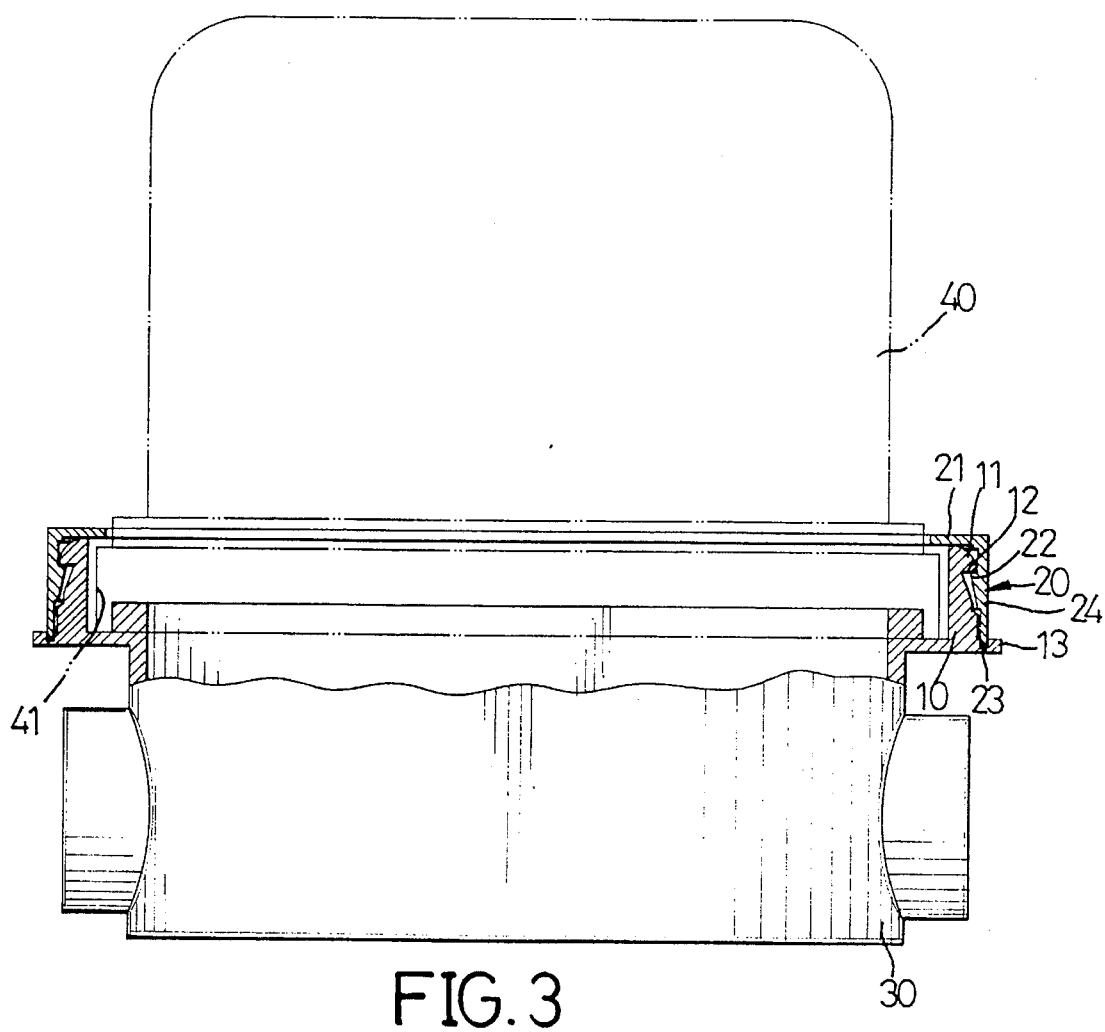
FIG. 3 is a schematic side elevational view similar to FIG. 2, wherein the sealing device is in an assembled position.
Figure 4:
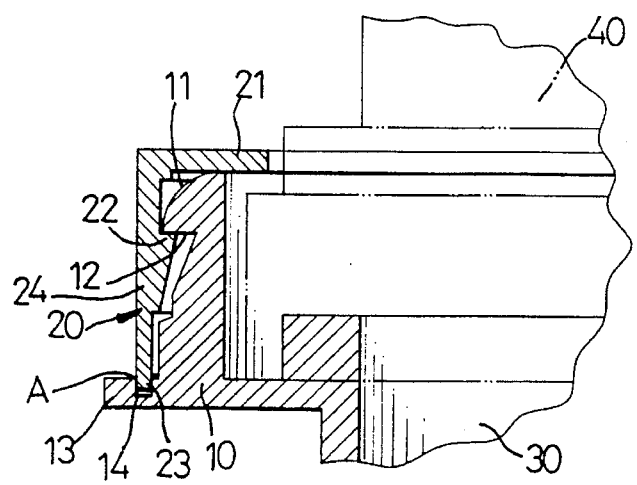
FIG. 4 is an enlarged fragmentary schematic sectional view illustrating detailed structure of the sealing device.

The outer ring 20 is L-shape in section and includes first and second annular arms 21, 24 disposed perpendicular to each other. The second annular arm 24 has a diameter greater than that of the wall of the positioning ring 10 so that the two rings may be disposed concentrically as illustrated in FIGS. 3 and 4. The second annular arm 24 further includes an annular engaging member 22 which projects outwardly from an inner wall thereof for engaging with the annular recess 12 in the positioning ring 10. A plurality of spaced-apart lugs 23 extend downwardly from a bottom of the second annular arm 24 for engaging with the apertures 14 in the positioning ring 10.

Figure 2:
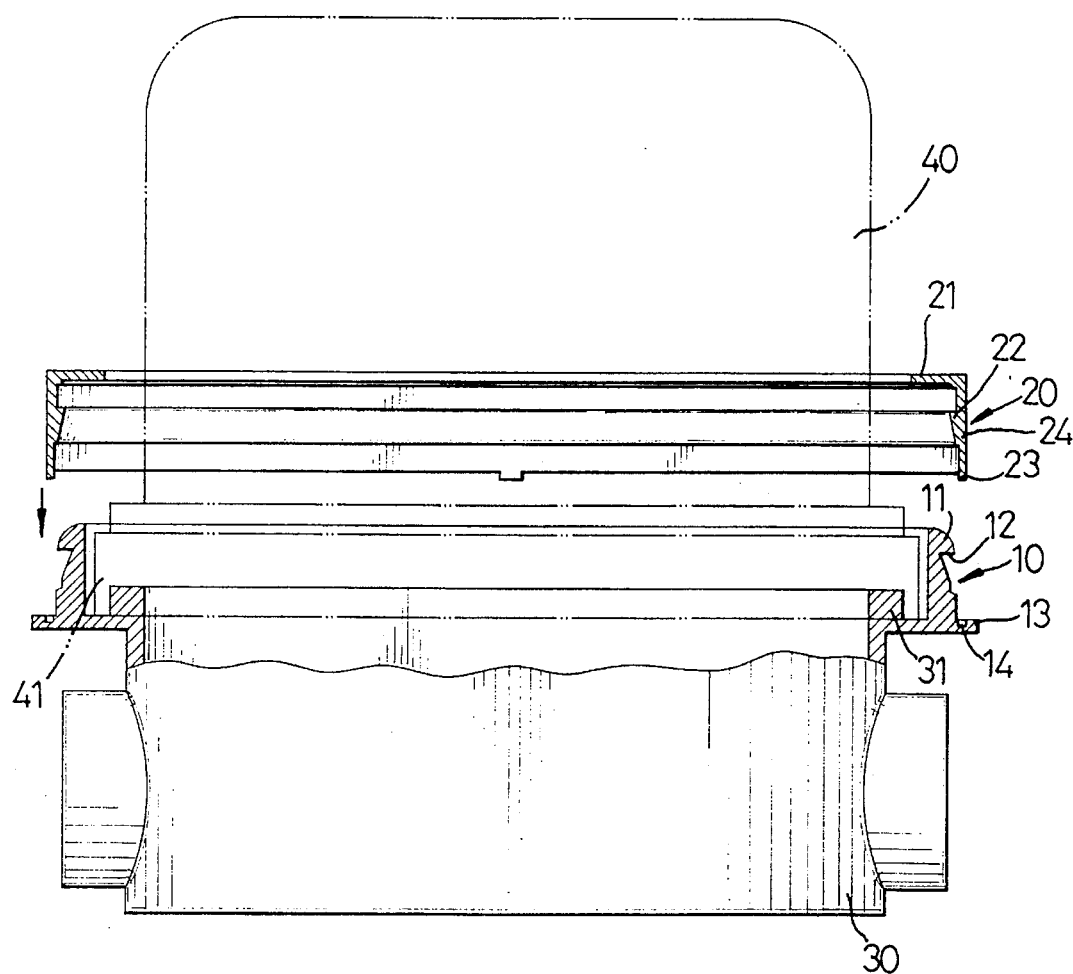
FIG. 2 is a schematic side elevational view, partly in section, illustrating assembly of the sealing device.

Referring to FIG. 2, in assembly, the meter socket 30 is firstly mounted to a wall and a transparent enclosure 40 is attached to the flange 31 of the meter socket 30 after an electric meter (not labeled) is mounted into the meter socket 30. A base 41 of the electrical meter is located between the flange 31 and the positioning ring 10. Thereafter, the outer ring 20 is passed over the enclosure 40 from a top of the latter and is then moved further downwardly by means of applying a downward force (see the arrow in FIG. 2) to urge the outer ring 20 to pass through the oblique upper end 11 of the positioning ring 10 which would firstly slightly contract inwardly and then return to its original position to provide a secure and irreversible positioning. With reference to FIG.. 3, as a result, the outer ring 20 is located concentrically around the positioning ring 10 with the annular engaging member 22 engaging with the annular recess 12 and with the lugs 23 engaging with the associated apertures 14 to prevent rotational movement of the outer ring 20 (see FIGS. 3 and 4).

By such an arrangement, unauthorized tampering with the electrical meter is possible only by prying at point A with a relatively large force and such action will cause breakage of the fragile outer ring 20. Accordingly, the electricity controlling authority may judge whether electricity has been fraudulently obtained.

Figure 5:
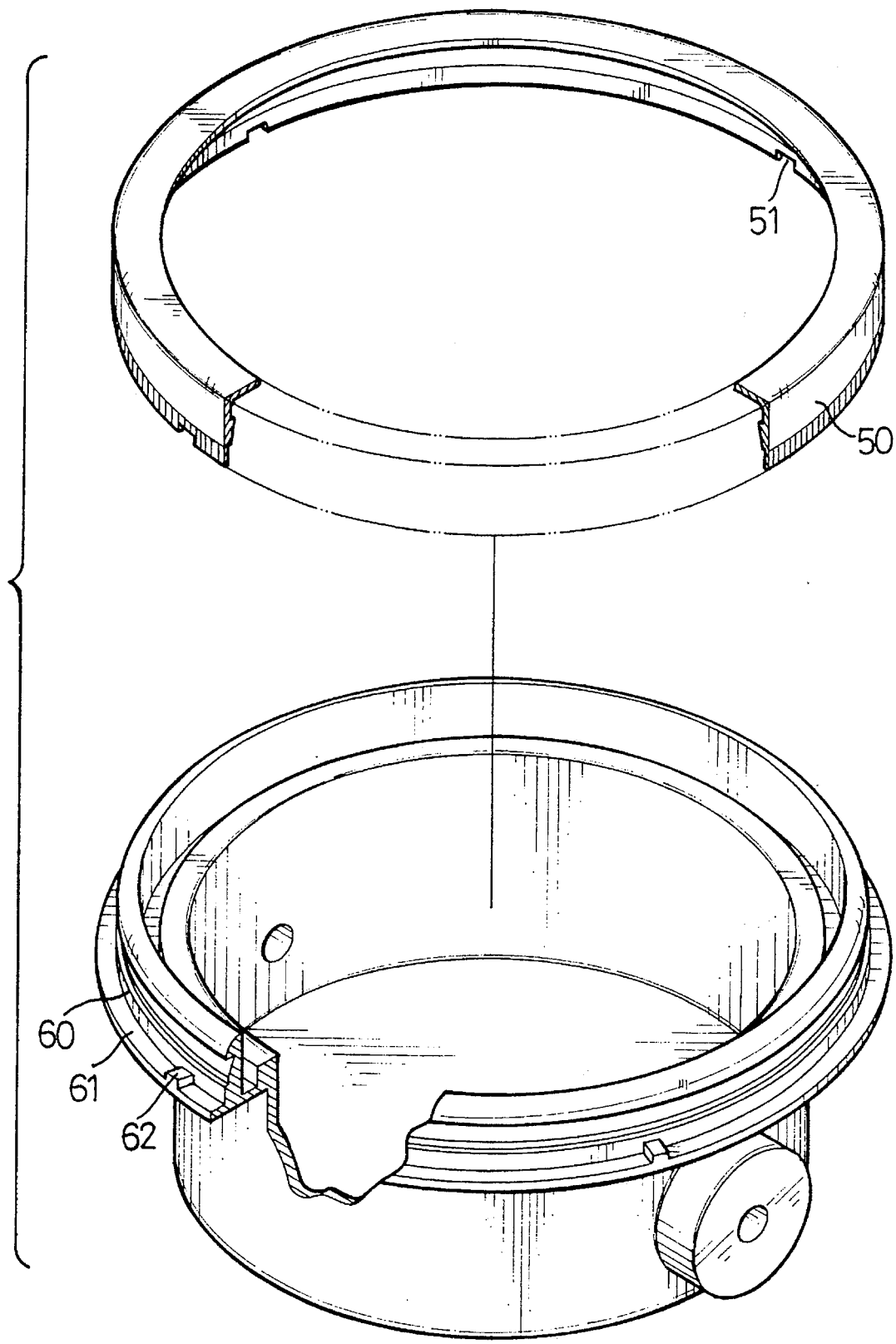
FIG. 5 is an exploded perspective view illustrating an alternative embodiment of the sealing device.
Figure 6:
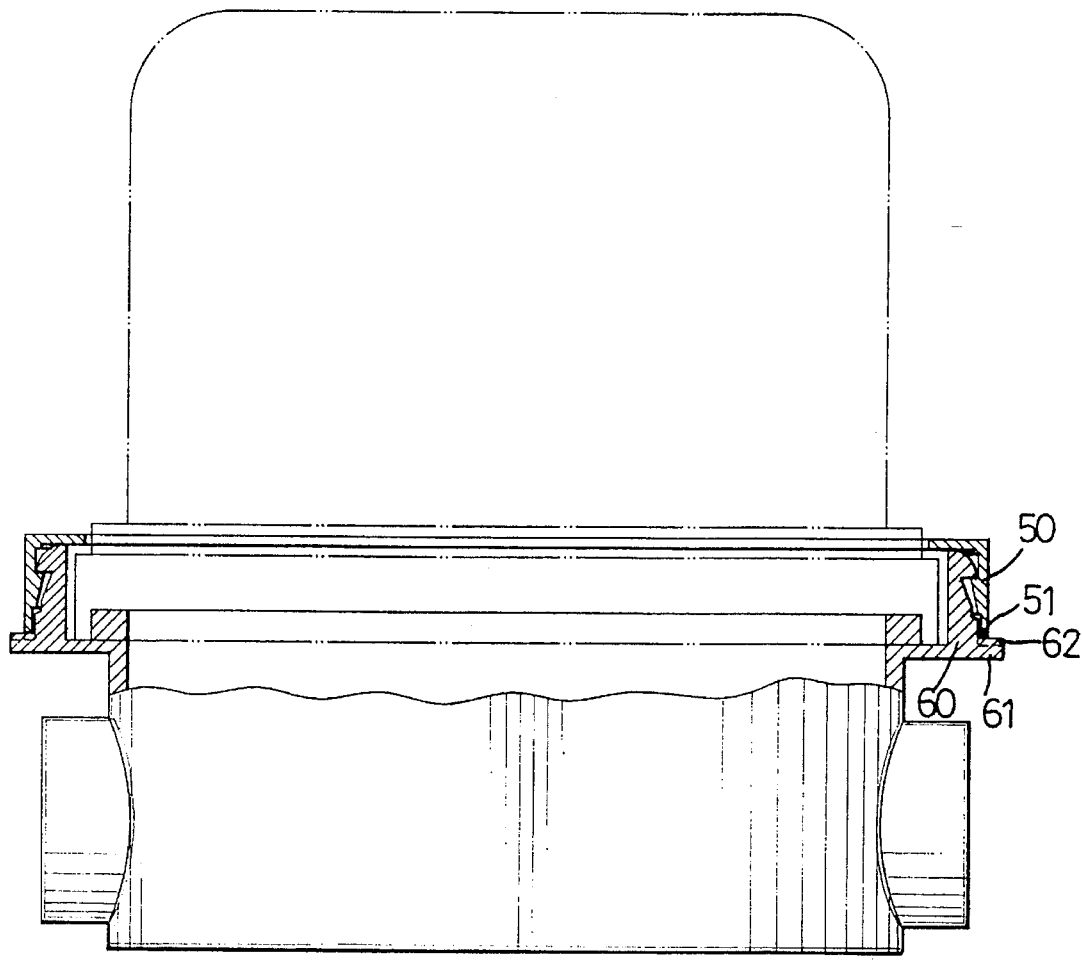
FIG. 6 is a schematic side elevational view, partly in section, wherein the sealing device in FIG. 5 is in an assembled position.
Figure 7:
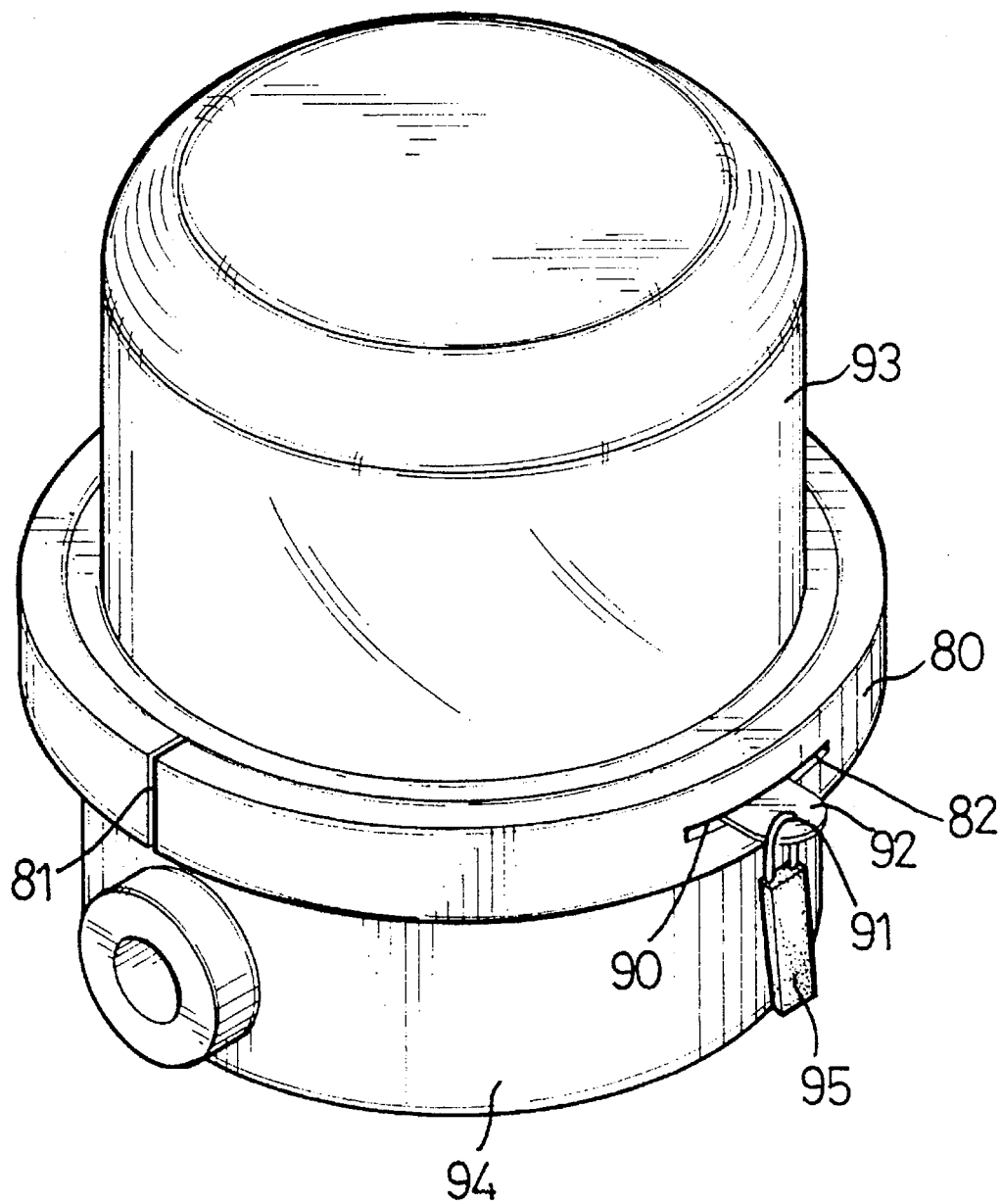
FIG. 7 is a perspective view of a conventional metallic sealing means for an electrical meter and a meter socket.

FIGS. 5 and 6 illustrate an alternative embodiment of the sealing device in which the fragile outer ring 50 is provided with a plurality of spaced-apart notches 51 at a bottom thereof while the positioning ring 60 includes a plurality of spaced-apart lugs 62 on an upper side of an annular ledge 61 which projects radially outwardly from a lower end thereof to achieve the same positioning effect as that provided by apertures 14 and lugs 23 of the first embodiment.

Although the invention has been explained in relation to its preferred embodiment, it is to be understood that many other possible modifications and variations can be made without departing from the spirit and scope of the invention as hereinafter claimed.

I claim:

1. A sealing device for interconnecting an electrical meter and a meter socket having an upper end, said sealing device comprising:

a positioning ring integral with said upper end of said meter socket and comprising an oblique circular upper end which inclines outwardly, an outer peripheral wall which has an annular recess therein, and an annular ledge extending radially outwardly from a lower end thereof and having a plurality of spaced-apart apertures therein; and a fragile outer ring which is L-shape in section and comprising first and second annular arms disposed perpendicular to each other, said second annular arm being concentrically disposed around said positioning ring and having an annular engaging member which projects outwardly from an inner wall thereof for engaging with said annular recess in said positioning ring and a plurality of spaced-apart lugs extending downwardly from a bottom thereof for engaging with said apertures in said positioning ring to prevent rotational movement of said outer ring.

2. A sealing device for interconnecting an electrical meter and a meter socket having an upper end, said sealing device comprising:

a positioning ring integral with said upper end of said meter socket and comprising an oblique circular upper end which inclines outwardly, an outer peripheral wall which has an annular recess therein, and an annular ledge extending radially outwardly from a lower end thereof and having a plurality of spaced-apart lugs formed on an upper side thereof; and a fragile outer ring which is L-shape in section and comprising first and second annular arms disposed perpendicular to each other, said second annular arm being concentrically disposed around said positioning ring and having an annular engaging member which projects outwardly from an inner wall thereof for engaging with said annular recess in said positioning ring and a plurality of spaced-apart notches defined in a bottom thereof for engaging with said lugs in said positioning ring to prevent rotational movement of said outer ring.

\* \* \* \* \*